United States Patent [19]
Jindal

[11] Patent Number: 5,821,758
[45] Date of Patent: Oct. 13, 1998

[54] TECHNIQUES FOR NON-INVASIVE RF CIRCUIT TESTING AND RF SIGNAL FLOW REDIRECTION

[75] Inventor: Renuka Prasad Jindal, Princeton, N.J.

[73] Assignee: Lucent Technologies Inc., Murray Hill, N.J.

[21] Appl. No.: 692,846

[22] Filed: Aug. 1, 1996

[51] Int. Cl.⁶ .................................................. G01R 31/28
[52] U.S. Cl. ........................ 324/512; 324/754; 324/534
[58] Field of Search ...................................... 324/500, 512, 324/519, 520, 525, 534, 754, 632, 555, 72.5

[56] References Cited

U.S. PATENT DOCUMENTS

| | | | |
|---|---|---|---|
| 4,565,966 | 1/1986 | Burr et al. | 324/519 |
| 5,420,500 | 5/1995 | Kerschner | 324/519 X |
| 5,488,313 | 1/1996 | Gourse et al. | 324/754 |

*Primary Examiner*—Michael Brock
*Attorney, Agent, or Firm*—Steven R. Bartholomew

[57] ABSTRACT

Methods and systems for non-invasive RF circuit testing, and/or for RF signal redirection, are disclosed. These methods and systems are used in conjunction with an RF circuit having a first circuit element, a second circuit element, a microstrip line coupling the first circuit element to the second circuit element, such that RF power flows along the microstrip line from the first circuit element to the second circuit element, and an RF test port for testing the RF circuit. A first removable electrical impedance is placed in physical proximity to the microstrip line to produce a first impedance mismatch at the microstrip line, such that some RF power is reflected by the mismatch back to the first circuit element. A second removable electrical impedance is placed in physical proximity to the microstrip line, such that the microstrip line is coupled to the RF test port.

34 Claims, 2 Drawing Sheets

TECHNIQUES FOR NON-INVASIVE RF CIRCUIT TESTING AND RF SIGNAL FLOW REDIRECTION

BACKGROUND

1. Field of the Invention

The invention relates generally to electronic circuit testing, and more specifically to the testing and redirection of signal flow in radio frequency (RF) circuit configurations.

2. Description of Related Art

In-circuit testing has been widely used to test the performance of electronic circuit configurations. In the case of circuits operating at DC or at relatively low frequencies (i.e., at frequencies below about 100 Khz), circuit testing may be performed in a relatively straightforward manner as, for example, by using test probes. However, as the operating frequency of the circuit elements increases, circuit testing becomes increasingly difficult because many measurement techniques disturb the operation of the circuit that is under test. At RF frequencies, a test probe presents circuit elements with a significant amount of series inductance and shunt capacitance, which can cause severe circuit mismatches, and, in the case of critical circuit elements such as oscillators, may cause the circuit to cease operation altogether. These circuit mismatches cause reflections and poor signal coupling to the test port.

One possible alternative technique for monitoring an RF signal at a given circuit test point is to cut the signal path and attach an RF connector to the test point. However, this process is destructive to a circuit board and tedious to implement in practice, due to the relatively small geometries of many RF circuit boards. After testing is completed, the signal path needs to be restored, and it is necessary to remove the RF connector, resulting in additional labor and expense.

SUMMARY OF THE INVENTION

Methods and systems for non-invasive RF circuit testing and RF signal flow redirection are disclosed. These methods and systems are used in conjunction with an RF circuit having a first circuit element, a second circuit element, a first microstrip line coupling the first circuit element to the second circuit element, such that RF power flows along the first microstrip line from the first circuit element to the second circuit element, a second microstrip line, and an optional RF test port, coupled to the second microstrip line, for testing the RF circuit. A first removable electrical impedance is placed in physical proximity to the first microstrip line to produce a first impedance mismatch at the first microstrip line, such that some RF power is reflected by the mismatch back to the first circuit element. A second removable electrical impedance is placed in physical proximity to the first microstrip line, such that the first microstrip line is coupled to the second microstrip line.

According to one embodiment, the first removable electrical impedance includes a first chip capacitor RF-coupled, and mechanically attached, to one end of a first finger, and the second electrical impedance includes a second chip capacitor mechanically attached to one end of a second finger. The first and second chip capacitors are brought in close physical proximity to the first microstrip line such that the chip capacitors are RF-coupled to the microstrip line. The reactances of the first and second chip capacitors are selected to provide relatively low impedances at the operating frequency of the RF circuit, such that the reactances are much less than the impedance of the first microstrip line, such that the first electrical impedance provides a shunt capacitive loading to ground across the first microstrip line, and such that the second electrical impedance is in series between the first microstrip line and the second microstrip line. The reactance of the second chip capacitor is selected to provide a specified amount of coupling between the first microstrip line and the second microstrip line. According to a further embodiment, the reactance of the first chip capacitor is selected to provide a desired amount of reflected RF power back to the first circuit element. The first finger may be either an electrically conductive finger or an insulated finger and, irrespective of the conductivity of the first finger, the second finger may be either an electrically conductive finger or an insulated finger.

DETAILED DESCRIPTION OF THE PREFERRED EMBODIMENTS

Figure 1:
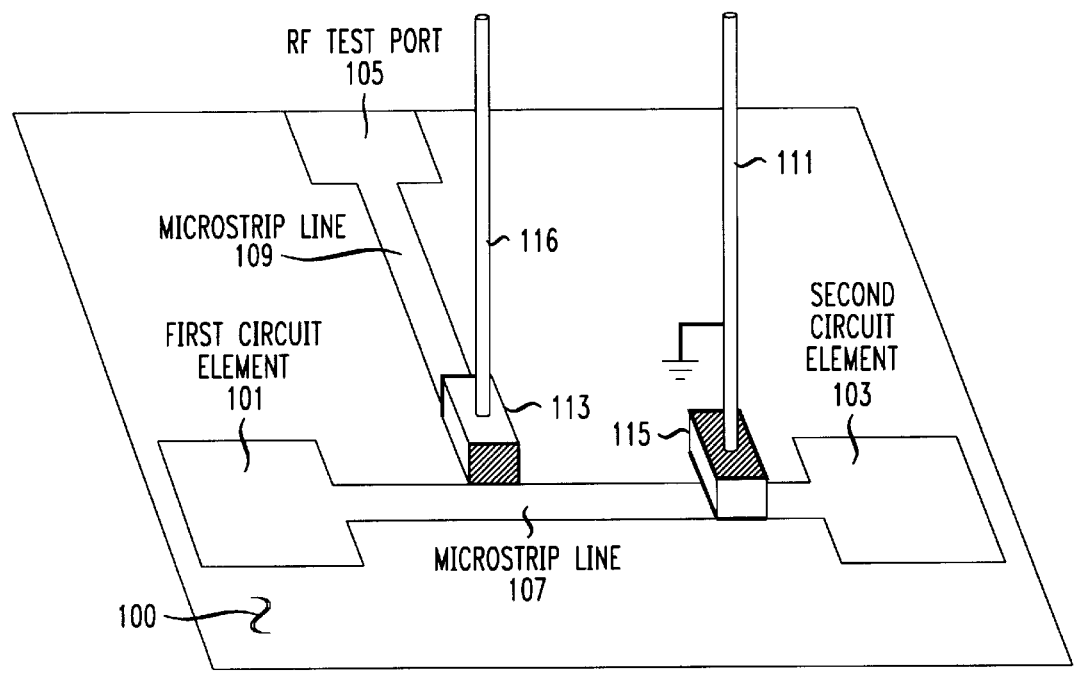
FIG. 1 is a perspective view of a hardware configuration setting forth a first illustrative embodiment of the invention disclosed herein.

FIG. 1 is a perspective view of a hardware configuration setting forth a first embodiment of the invention disclosed herein. This embodiment is used in conjunction with an RF circuit having a first circuit element 101, a second circuit element 103, a first microstrip line 107 coupling the first circuit element 101 to the second circuit element 103, such that RF power flows along the first microstrip line 107 from the first circuit element 101 to the second circuit element 103, a second microstrip line 109, and an optional RF test port 105, coupled to the second microstrip line 109, for testing the RF circuit. RF test port 105 represents a convenient test point on second microstrip line 109 to which test equipment may be connected. In practice, RF test port 105 may be represented by an RF connector coupled to second microstrip line 109.

A first removable electrical impedance is placed in physical proximity to the first microstrip line 107 to produce a first impedance mismatch at the first microstrip line 107, such that some RF power is reflected by the mismatch back towards the first circuit element 101. A second removable electrical impedance is placed in physical proximity to first microstrip line 107 and second microstrip line 109, such that first microstrip line 107 is coupled to the second microstrip line 109 through the second removable electrical impedance. At least a portion of the RF power reflected by the first removable electrical impedance is coupled into the second removable electrical impedance.

The first removable electrical impedance includes a first chip capacitor 115 having a first terminal and a second terminal. The first terminal of the first chip capacitor 115 is RF-coupled, and mechanically attached, to a first end of a first finger 111. In the present example, first finger 111 is electrically conductive. The second electrical impedance includes a second chip capacitor 113 having a first terminal and a second terminal. The body (i.e., an electrically insulated portion) of the second chip capacitor is mechanically attached to a first end of a second finger 1 16. Second finger 116 may be an electrically insulated finger or, alternatively, this finger could be electrically conductive.

The first and second removable electrical impedances are removable in the sense that, when the first ends of the first and second electrically conductive fingers 111, 116, respectively, are brought in close physical proximity to the first microstrip line 107, the second terminals of the first and second chip capacitors 115, 113, respectively, are RFcoupled to the first microstrip line 107, and the second terminals of first and second chip capacitors 1 15, 113, respectively, may actually be in physical contact with first microstrip line 107. At this time, the first terminal of the second chip capacitor 113 is RF-coupled to second microstrip line 109, and this terminal may also be in actual physical contact with second microstrip line 109. When the first and second fingers 111, 116, respectively, are moved such that these fingers are no longer in close physical proximity to first microstrip line 107 (and second microstrip line 109), any physical contact between the second terminals of chip capacitors 113, 115 and first microstrip line 107 is broken, any physical contact between second microstrip line 109 and chip capacitor 113 is broken, and chip capacitors 113, 115 are no longer RF-coupled to first microstrip line 107.

The reactances of the first and second chip capacitors 115, 113, respectively, are selected to provide relatively low impedances at the operating frequency of the RF circuit, such that the reactances are much less than the impedances of first microstrip line 107 and/or second microstrip line 109. In order to select an appropriate value for the first chip capacitor 115 and the second chip capacitor 113, note that the first electrical impedance effectively provides a shunt capacitive loading to ground across the microstrip line 107, and that the second electrical impedance effectively controls the amount of coupling between first microstrip line 107 and optional RF test port 105 via second microstrip line 109. The shunt capacitive loading of the first impedance is used to reflect RF power traveling on a microstrip line back towards its source, and the second impedance is used to extract some or all of the RF power reflected by the first impedance so that this reflected power can be applied to test equipment. Therefore, the reactance of the second chip capacitor 113 may be selected to provide a specified amount of coupling between the first microstrip line 107 and the RF test port 105. According to a further embodiment, the reactance of the first chip capacitor 115 is selected to provide a desired amount of reflected RF power back to the first circuit element 101.

First finger 111 may be fabricated of either electrically conductive material, or electrically insulating material. Irrespective of whether or not first finger 111 is fabricated of electrically conductive material, second finger 116 may be fabricated of either electrically conductive material or electrically insulating material. However, if first finger 111 is fabricated of electrically insulating material, some structure must then be provided for RF-grounding the first terminal of the first chip capacitor 115. If the first finger 111 is fabricated from electrically conductive material, then an RF ground may be applied through the finger itself. To this end, note that the reactance of first capacitor 115 may optionally be selected to compensate for, and/or to resonate with, the series inductance of first finger 1 16 if first finger 116 is electrically conductive.

Due to the fact that first finger 111 and/or second finger 116 may carry RF currents, these fingers should be designed to keep series inductance to a minimum. Accordingly, fingers should be designed to be as short as is feasible for a given system application. The length of the fingers becomes increasingly critical as the frequency of operation increases. In some frequency ranges, an alternative to minimizing the length of the fingers is to adjust the length of the fingers so as to provide a specified amount of inductance. This inductance could then be resonated with the capacitive reactance of a chip capacitor situated at either (or both) end(s) of the finger.

In general, first finger 111 can be either a conducting finger or a nonconducting finger. Second finger 116 can also be either a conducting finger or a nonconducting finger, independently of whether first finger 111 is conducting or nonconducting. The first finger 111 is used to apply a first impedance—i.e., a shunt capacitance—across a section of microstrip line 107 using any of a variety of mechanical structures. For example, pursuant to a mechanical structure to be described in conjunction with FIG. 2, an RF ground trace 230 is provided on circuit board 200 near a first microstrip line 207. First finger 242 can be nonconductive, since the function of first finger 242 in this case is merely to hold chip capacitor 215 in a position such that the capacitor shunts the gap between microstrip line 207 and the RF ground trace 230 (this structure will be described in more detail in conjunction with FIG. 2). However, in the absence of an RF ground trace sufficiently close to microstrip line 107 (FIG. 1), the first finger 111 should be conductive, so as to provide an RF ground to one end of the chip capacitor 115, as shown in FIG. 1. Note that the ground shown as connected to the first finger 111 is provided by a low-inductance strap connecting first finger 111 to a good RF ground. Also note that, in the mechanical structure of FIG. 2, the chip capacitor 215 is mounted to first finger 242 such that neither the first terminal nor the second terminal of the chip capacitor contacts first finger 242. By contrast, in the mechanical structure of FIG. 1, where there is no RF ground trace sufficiently close to the microstrip line 107, one terminal of the chip capacitor 115 is electrically coupled to an electrical ground provided by first finger 111.

Second finger 116 can be either conductive or nonconducting, according to the following examples. If an RF port 105 exists on a circuit board 100 to be tested, the function of second finger 116 is to bridge the gap between microstrip line 107 and microstrip line 109, where microstrip line 109 is connected to the RF port 105, in order to couple RF energy into RF port 105. In this example, the second finger 116 provides a function of mechanical support only, but need not carry any RF current. Therefore, the second finger 116 in this case is fabricated of insulating material. On the other hand, second finger 116 could be used to convey RF energy from circuit board 100 to external test equipment, even if circuit board 100 does not include an RF test port 105. In such a case, second finger 116 is effectively used as an RF probe, and is therefore fabricated of electrically conductive material. In addition, the length and/or inductive properties of an electrically conductive second finger 116 can be designed to provide series resonance with second chip capacitor 113 at a specified frequency, or to provide a matched impedance at a specified frequency.

The first and second removable impedances are used to non-invasively divert RF power traveling from a source to a destination along a microstrip line, such that some or all of this power is diverted into test equipment for testing purposes, when these impedances are brought into contact with the microstrip line by the first and second fingers 111, 116. When these removable impedances are removed from the microstrip line, RF power is no longer diverted into test equipment, and RF power traveling on this microstrip line will now flow from source to destination without diversion. In addition, this technique can be used to route RF energy around faulty electronic components, essentially performing RF circuit failure diagnosis, circuit repair, and healing. The fingers, in this case, are part of the RF circuit casing.

In practice, an RF circuit may include circuit elements in addition to those shown in FIG. 1. These elements are typically coupled to one another using sections of microstrip line attached to a circuit board. If it is desired to test such a circuit board, a plurality of first and second electrical impedance pairs may be provided, wherein each of these electrical impedance pairs is used to test a specific circuit element on the circuit board.

Figure 2:
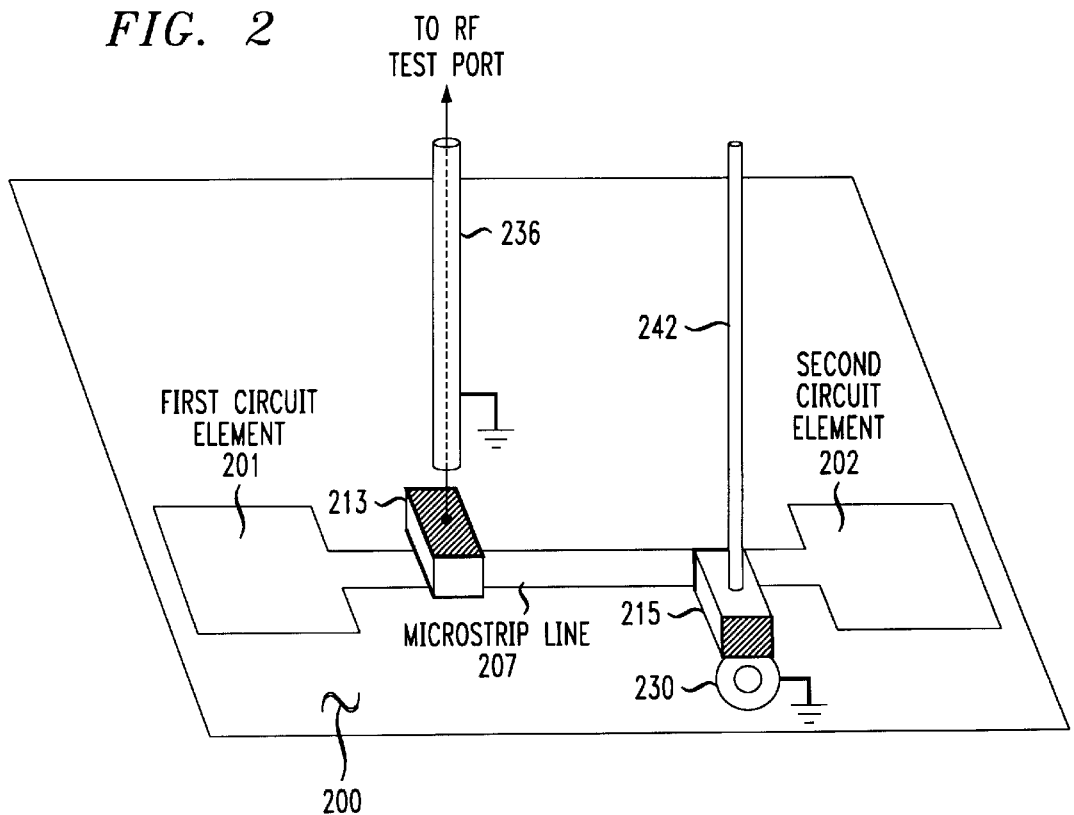
FIG. 2 is a perspective view of a hardware configuration setting forth a second illustrative embodiment of the invention disclosed herein.

FIG. 2 is a perspective view of a hardware configuration setting forth a second embodiment of the invention disclosed herein. This embodiment is used in conjunction with an RF circuit board 200 having a first circuit element 201, a second circuit element 202, and a microstrip line 207 coupling the first circuit element 201 to the second circuit element 202, such that RF power flows along the microstrip line 207 from the first circuit element 201 to the second circuit element 202.

A first removable electrical impedance is placed in physical proximity to the microstrip line 207 to produce a first impedance mismatch at the microstrip line 207, such that some RF power is reflected by the mismatch back towards the first circuit element 201. A second removable electrical impedance is placed in physical proximity to the microstrip line 207, so as to permit the microstrip line 207 to be coupled to an external RF test port. At least a portion of the RF power reflected by the first removable electrical impedance is coupled into the second removable electrical impedance.

The first removable electrical impedance includes a first chip capacitor 215 having a first terminal and a second terminal. The electrically nonconductive body of chip capacitor 215 is mounted to a first finger 242, which can be fabricated of electrically insulating material. When first finger 242 is positioned so as to place chip capacitor 215 in close physical proximity to RF circuit board 200, a first terminal of first chip capacitor 215 becomes RF-coupled to, and may mechanically contact, an RF ground trace 230 on RF circuit board 200. At this time, a second terminal of first chip capacitor 215 becomes RF-coupled to, and may mechanically contact, microstrip line 207.

The second electrical impedance includes a second chip capacitor 213 having a first terminal and a second terminal. The first terminal of the second chip capacitor 213 is electrically coupled to an inner conductor of a second finger 236 which, in the present example, is a coaxial finger. Such a coaxial finger could be fabricated, for example, using semirigid coaxial cable. When second finger 236 is positioned so as to place chip capacitor 213 in close physical proximity to RF circuit board 200, the second terminal of second chip capacitor 213 becomes RF-coupled to, and may mechanically contact, microstrip line 207. In this manner, when the first and second fingers 242, 236 are positioned in close physical proximity to RF circuit board 200 as described above, some of the RF power traveling along microstrip line 207 from first circuit element 201 to second circuit element 202 is reflected back to first circuit element 201 by chip capacitor 215. At least a portion of this reflected RF power is then extracted by chip capacitor 213 and second finger 236. Note that, in some situations, the chip capacitor 213 could be eliminated, whereby the second finger 236 essentially functions as a conventional RF probe.

Although the embodiments disclosed in FIGS. 1 and 2 use specific types of first fingers and second fingers, this is for purposes of illustration only, it being understood that any of various types of fingers could be used for the first and second fingers of FIGS. I and 2. For example, the coaxial finger of FIG. 2 (reference numeral 236) could be employed as the second finger 116 of FIG. 1, if a chip capacitor is mounted to the coaxial finger as shown in FIG. 2. Similarly, the first finger 242 of FIG. 2 could be employed as the first finger 111 of FIG. 1, if a suitable ground trace 230 were to be found on circuit board 100.

Figure 3:
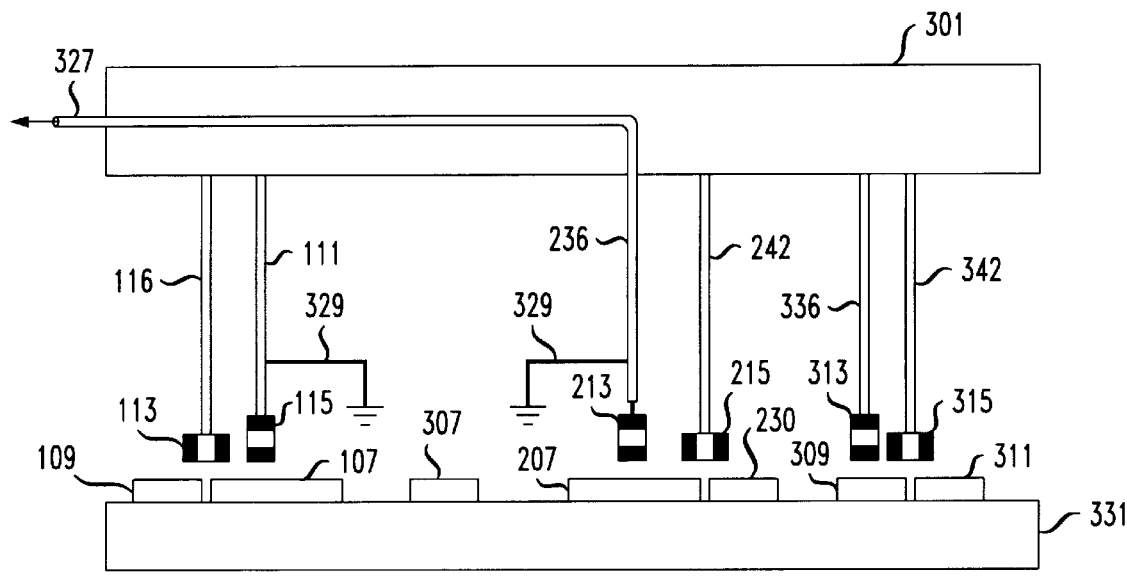
FIG. 3 is a side view of a hardware configuration setting forth a third illustrative embodiment of the invention disclosed herein.

FIG. 3 is a side view of a hardware configuration setting forth a third illustrative embodiment where a plurality of electrical impedance pairs are used to test a plurality of circuit elements on a circuit board. A first electrical impedance pair includes a first finger 111, a first chip capacitor 115 having a first terminal mounted on one end of first finger 111 (which is an electrically conductive finger), a second finger 116, and a second chip capacitor 113 having its nonconductive body mounted on one end of second finger 116. The first electrical impedance pair is used to test RF circuit elements that are coupled to a first microstrip line 107 attached to an RF circuit board 100.

The first finger 111, coupled to ground 329, results in the application of a shunt capacitance to first microstrip line 107 when the second terminal of the first chip capacitor 115 is brought into contact with first microstrip line 107. This shunt capacitance reflects some or all of the RF power traveling on the microstrip line 107 back to its source. The second finger 116 couples a portion of the RF power on first microstrip line 107 which has been reflected by first electrically conductive finger 111, into a second microstrip line 109 when the first and second terminals of the second chip capacitor 113 are brought into contact with the first microstrip line 107 and the second microstrip line 109. It is assumed that second microstrip line 109 is coupled to a test port where the coupled RF power may be inputted to one or more test instruments. In this manner, the first chip capacitor 115 and the first (electrically conductive) finger 116 are used to selectively redirect a desired amount of RF power to the second chip capacitor 113 and the second finger 116, and this redirected power can be coupled to any of various electronic test instruments, such as, for example, an RF power meter, a spectrum analyzer, a directional coupler, a demodulator, a modulation analyzer, and/or other types of test equipment.

A second electrical impedance pair includes a third finger 242, a third chip capacitor 215 having its insulated body mounted on one end of third finger 242, a fourth finger 236 which is a coaxial finger, and a fourth chip capacitor 213 having a first terminal mounted on one end of the inner conductor of the fourth finger 213. The second electrical impedance pair is used to test RF circuit elements that are coupled to microstrip line 207. The third finger 242 is used to apply a shunt capacitance across microstrip line 207 when the first and second terminals of the third chip capacitor 215 are brought into contact with first microstrip line 207 and ground trace 230, respectively. The fourth finger 236 and the fourth chip capacitor 213, coupled to test port 327, redirect at least a portion of the RF power on microstrip line 207 that was reflected by the third capacitor 215. This RF power is redirected to the test port 327 when the second terminal of the fourth chip capacitor 213 is brought into contact with microstrip line 207.

A third electrical impedance pair includes a fifth finger 342, a fifth chip capacitor 315, a sixth finger 336, and a sixth chip capacitor 313. The sixth finger 336 is electrically conductive, and applies a shunt capacitance across microstrip line 309. The fifth finger 342 applies a series capacitance between microstrip line 309 and microstrip line 311, where microstrip line 311 is coupled to a test port.

In the example of FIG. 3, an end of each of the first, second, third, fourth, fifth and sixth fingers 111, 116, 242, 236, 342, 336 is mounted onto a test fixture plate 301. These fingers may optionally be mounted to the test fixture plate 301 such that some or all of the fingers may be selectively retracted away from the circuit board 331 under test, and/or extended towards the circuit board 331 under test. This option permits the performance of a plurality of tests on circuit board 331, wherein each test is characterized by a certain combination of extended and/or retracted fingers. For a given test, some fingers will be extended such that the chip capacitor attached to this finger will contact the circuit board 331 under test, whereas other fingers will be retracted so that the chip capacitor attached to such a finger will not contact the circuit board 331 under test. Any of various methods may be employed to retractably or extendably mount the fingers onto test fixture plate 301, and/or the fingers themselves may include a mechanism for extension, expansion, and/or retraction, such as, for example, the use of telescopic and/or hydraulically controlled fingers.

The mounting locations of these fingers on the test fixture plate 301 is determined by the specific configuration of microstrip lines 109, 107, 307, 207, 230, 309, 311 on a circuit board 33 1 which it is desired to test. During the testing of a circuit board, the test fixture plate 301 is brought into mechanical alignment with a circuit board 331 to be tested, such that, if all of the fingers on the test fixture plate 301 were to be placed in a fully-extended position, one terminal of the first chip capacitor 115, and one terminal of the second chip capacitor 113, would contact the first microstrip line 107. The remaining terminal of the second chip capacitor would contact microstrip line 109, the terminals of the third and fourth chip capacitors would contact microstrip lines 207 and/or 230, and the terminals of the fifth and sixth chip capacitors would contact microstrip lines 309 and/or 311. During testing of circuit board 331, selected ones of the first, third, and sixth fingers 111, 242, 336 divert RF power to, respectively, the second, fourth, and fifth fingers 116, 236, 342, thereby coupling RF signals to test port 327 and/or a test port coupled to microstrip line 109, so that testing operations may be performed. After testing of this circuit board 331 has been completed, circuit board 331 and test fixture plate 301 are moved apart, and the next circuit board to be tested is mechanically aligned with the test fixture plate 301.

In the example of FIG. 3, the use of three pairs of fingers is shown for purposes of illustration only, it being understood that any desired number of fingers may be employed. For example, FIG. 3 shows first, second, third, fourth, fifth, and sixth fingers 111, 116, 242, 236, 342, 336 arranged in three pairs - a first pair that includes first and second fingers 111, 116, a second pair that includes third and fourth fingers 242, 236, and a third pair that includes fifth and sixth fingers 342, 336. However, a number of finger pairs greater than three, or less than three, could be employed.

Although the illustrative arrangement of FIG. 3 shows fingers arranged in pairs, note that not all of the fingers need to be paired. For example, if a microstrip line 207 is connected to a relatively uncritical portion of an RF circuit, or if this microstrip line 207 is merely used to carry a DC voltage, the fifth finger 242 could be eliminated, whereas the fourth finger 236 would be used to probe microstrip line 207. Moreover, if it is desired to probe a DC voltage on a given microstrip line, then the chip capacitor is eliminated from the end of the finger used to contact that microstrip line, and this finger may be mechanically lengthened to compensate for the lack of a chip capacitor at the end of the finger.

Figure 4:
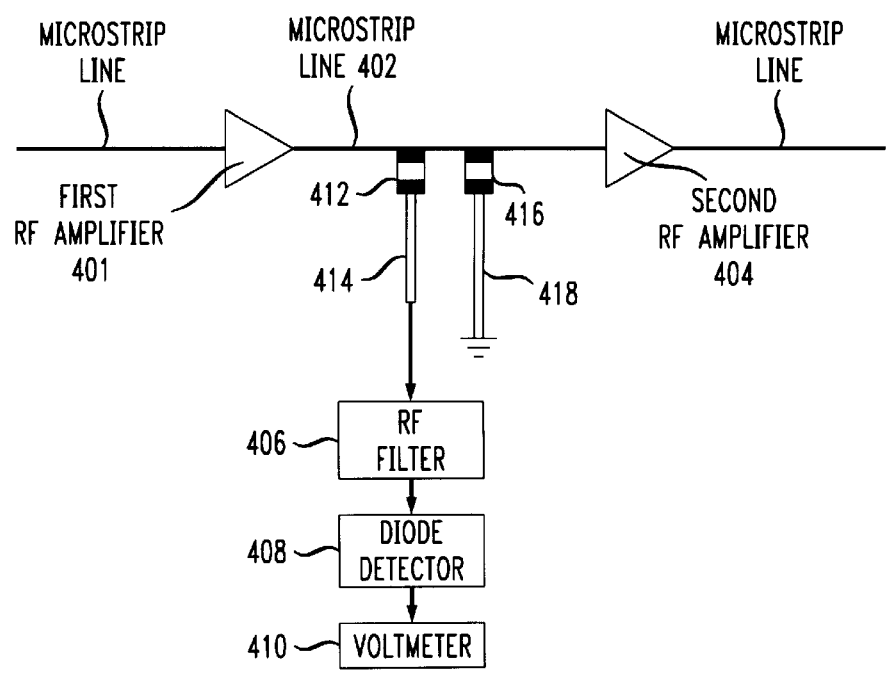
FIG. 4 is a hardware block diagram setting forth a fourth illustrative embodiment of the invention disclosed herein.

FIG. 4 is a hardware block diagram setting forth a fourth illustrative embodiment of the invention disclosed herein. An RF circuit board to be tested includes a first RF amplifier 401 and a second RF amplifier 404. The output of the first RF amplifier 401 is applied to the input of a second RF amplifier 404 using a section of microstrip line 402. Assume that it is desired to measure the RF power of a signal at the output of first RF amplifier 401. At a location on the microstrip line 402 which is a first distance from the output of the first RF amplifier 401, a first terminal of a first chip capacitor 412 is in removable contact with microstrip line 402. The second terminal of first chip capacitor 412 is RF-coupled, and mechanically attached to, a first end of a first finger 414, which in the present example, is an electrically conductive finger. At a location on the microstrip line 402 which is a second distance from the output of the first RF amplifier 401, where the second distance is greater than the first distance, a first terminal of a second chip capacitor 416 is in removable contact with the microstrip line 402. The second terminal of second chip capacitor 416 is RF-coupled to, and mechanically attached to, a first end of a second finger 418, which, in the present example, is an electrically conductive finger. The second end of the second finger 418 is grounded, for example, to an RF ground plane on the circuit board to which the first and second RF amplifiers 401, 404 are mounted.

When the first terminal of the second chip capacitor 416 is in contact with microstrip line 402, at least a portion of the RF power traveling from first RF amplifier 401 to second RF amplifier 404 along microstrip line 402 is reflected back to first RF amplifier 401. If the first terminal of the first chip capacitor 412 is also in contact with microstrip line 402, some or all of the RF power that was reflected by the second chip capacitor 416 is reflected into the first chip capacitor 412. The reactance of the second chip capacitor 416 may optionally be selected so as to reflect a specified portion of RF power traveling on microstrip line 402 in a direction back towards the output of the first RF amplifier 401. In this manner, the combination of the second chip capacitor 416 and the second electrically conductive finger 418 selectively redirects RF power into the combination of the first chip capacitor 412 and the first electrically conductive finger 414, where the redirected RF power may be applied to test equipment.

In the example of FIG. 4, the second end of the first electrically conductive finger 414 is coupled to test equipment in the form of an RF filter 406. The RF filter 406 could be, for example, a bandpass filter centered at a desired or test transmitting frequency. Once out-of-band components have been filtered out of the RF signal extracted by chip capacitor 412 and first electrically conductive finger 414, the output of the RF filter 406 is coupled to a diode detector 408. Diode detector 408 could be, for example, an RF diode that generates a DC voltage substantially proportional to the power of the RF carrier applied to the diode. The DC output of the diode detector 408 is then fed to a voltmeter 410 which provides an indication of the relative amount of RF power generated by first RF amplifier 401.

We claim:

1. A system for non-invasive RF circuit testing of an RF circuit having a first circuit element, a second circuit element, a microstrip line coupling the first circuit element to the second circuit element, such that RF power flows along the microstrip line from the first circuit element to the second circuit element, the system comprising:

(a) a first removable electrical impedance which, when placed in physical proximity to the microstrip line, produces a first impedance mismatch at the microstrip line, such that at least a portion of RF power traveling on the microstrip line is reflected by the mismatch back to the first circuit element;

(b) a second removable electrical impedance which, when placed in physical proximity to the microstrip line, couples RF power reflected by the first removable electrical impedance into an RF test port coupled to the second removable electrical impedance.

2. The system of claim 1 wherein the first removable electrical impedance includes a first chip capacitor having a first terminal RF-coupled, and mechanically attached, to one end of a first finger, wherein the first finger is electrically conductive, and the second electrical impedance includes a second chip capacitor having an insulated body mechanically attached to one end of a second finger.

3. The system of claim 2 including means for placing the first and second chip capacitors into close physical proximity to the microstrip line such that the chip capacitors are RF-coupled to the microstrip line.

4. The system of claim 2 wherein the reactances of the first and second chip capacitors are selected to provide relatively low impedances at the operating frequency of the RF circuit, such that the reactances are much less than the impedance of the microstrip line, and such that the first electrical impedance provides a shunt capacitive loading to ground across the microstrip line.

5. The system of claim 2 wherein the reactance of the first chip capacitor is selected to provide a desired amount of reflected RF power back to the first circuit element.

6. The system of claim 1 wherein the first removable electrical impedance includes a first chip capacitor having a first terminal RF-coupled, and mechanically attached, to one end of a first finger, wherein the first finger is electrically conductive, and the second electrical impedance includes a second chip capacitor having a first terminal RF-coupled, and mechanically attached, to one end of a second finger, wherein the second finger is electrically conductive.

7. The system of claim 6 wherein the second finger electrically couples the first terminal of the second chip capacitor to an RF test port.

8. The system of claim 6 including means for placing the first and second chip capacitors into close physical proximity to the microstrip line such that the chip capacitors are RF-coupled to the microstrip line.

9. The system of claim 6 wherein the reactances of the first and second chip capacitors are selected to provide relatively low impedances at the operating frequency of the RF circuit, such that the reactances are much less than the impedance of the microstrip line, and such that the first electrical impedance provides a shunt capacitive loading to ground across the microstrip line.

10. The system of claim 6 wherein the second finger is coupled to the RF test port, and the reactance of the second chip capacitor is selected to provide a specified amount of coupling between the microstrip line and the RF test port.

11. The system of claim 6 wherein the reactance of the first chip capacitor is selected to provide a desired amount of reflected RF power back to the first circuit element.

12. The system of claim 1 wherein the first removable electrical impedance includes a first chip capacitor having a first terminal RF-coupled, and mechanically attached, to one end of a first finger, wherein the first finger is electrically conductive, and the second electrical impedance includes a second chip capacitor having a first terminal RF-coupled, and mechanically attached, to one end of an inner conductor of a second finger, wherein the second finger is a coaxial finger having an inner conductor and an outer conductor.

13. The system of claim 12 wherein the second finger electrically couples the first terminal of the second chip capacitor to an RF test port.

14. The system of claim 12 including means for placing the first and second chip capacitors into close physical proximity to the microstrip line such that the chip capacitors are RF-coupled to the microstrip line.

15. The system of claim 12 wherein the reactances of the first and second chip capacitors are selected to provide relatively low impedances at the operating frequency of the RF circuit, such that the reactances are much less than the impedance of the microstrip line, and such that the first electrical impedance provides a shunt capacitive loading to ground across the microstrip line.

16. The system of claim 12 wherein the second finger is coupled to the RF test port, and the reactance of the second chip capacitor is selected to provide a specified amount of coupling between the microstrip line and the RF test port.

17. The system of claim 12 wherein the reactance of the first chip capacitor is selected to provide a desired amount of reflected RF power back to the first circuit element.

18. The system of claim 1 wherein the first removable electrical impedance includes a first chip capacitor having an insulated body mechanically attached to one end of a first finger, and the second electrical impedance includes a second chip capacitor having an insulated body mechanically attached to one end of a second finger.

19. The system of claim 18 including means for placing the first and second chip capacitors into close physical proximity to the microstrip line such that the chip capacitors are RF-coupled to the microstrip line.

20. The system of claim 18 wherein the reactances of the first and second chip capacitors are selected to provide relatively low impedances at the operating frequency of the RF circuit, such that the reactances are much less than the impedance of the microstrip line, and such that the first electrical impedance provides a shunt capacitive loading to ground across the microstrip line.

21. The system of claim 18 wherein the second finger is coupled to the RF test port, and the reactance of the second chip capacitor is selected to provide a specified amount of coupling between the microstrip line and the RF test port.

22. The system of claim 18 wherein the reactance of the first chip capacitor is selected to provide a desired amount of reflected RF power back to the first circuit element.

23. The system of claim 1 wherein the first removable electrical impedance includes a first chip capacitor having an insulated body mechanically attached to one end of a first finger, and the second electrical impedance includes a second chip capacitor having a first terminal RF-coupled, and mechanically attached to, one end of a second finger.

24. The system of claim 23 wherein the second finger electrically couples the first terminal of the second chip capacitor to an RF test port.

25. The system of claim 23 including means for placing the first and second chip capacitors into close physical proximity to the microstrip line such that the chip capacitors are RF-coupled to the microstrip line.

26. The system of claim 23 wherein the reactances of the first and second chip capacitors are selected to provide relatively low impedances at the operating frequency of the RF circuit, such that the reactances are much less than the impedance of the microstrip line, and such that the first electrical impedance provides a shunt capacitive loading to ground across the microstrip line.

27. The system of claim 23 wherein the second finger is coupled to the RF test port, and the reactance of the second chip capacitor is selected to provide a specified amount of coupling between the microstrip line and the RF test port.

28. The system of claim 23 wherein the reactance of the first chip capacitor is selected to provide a desired amount of reflected RF power back to the first circuit element.

29. A method for non-invasive RF circuit testing of an RF circuit having a first circuit element, a second circuit element, a microstrip line coupling the first circuit element to the second circuit element, such that RF power flows along the microstrip line from the first circuit element to the second circuit element, the method including the steps of:

(a) placing a first removable electrical impedance in physical proximity to the microstrip line to produce a first impedance mismatch at the microstrip line, such that at least a portion of RF power traveling on the microstrip line is reflected by the mismatch back to the first circuit element; and (b) placing a second removable electrical impedance in physical proximity to the microstrip line, wherein RF power reflected by the first removable electrical impedance is coupled into an RF test port coupled to the second removable electrical impedance.

30. The method of claim 29 wherein said first removable electrical impedance includes a first chip capacitor mechanically attached to one end of a first finger, and said second removable electrical impedance includes a second chip capacitor mechanically attached to one end of a second finger.

31. The method of claim 30 including the step of placing the first and second chip capacitors into close physical proximity to the microstrip line such that the chip capacitors are RF-coupled to the microstrip line.

32. The method of claim 31 further including the step of determining the reactances of the first and second chip capacitors so as to provide relatively low impedances at the operating frequency of the RF circuit, such that the reactances are much less than the impedance of the microstrip line, and such that the first electrical impedance provides a shunt capacitive loading to ground across the microstrip line.

33. The method of claim 31 further including the step of coupling the second finger to the RF test port, and determining the reactance of the second chip capacitor so as to provide a specified amount of coupling between the microstrip line and the RF test port.

34. The system of claim 31 including the step of determining the reactance of the first chip capacitor so as to provide a desired amount of reflected RF power back to the first circuit element.

* * * * *